United States Patent
Kamp-Froese et al.

(10) Patent No.: US 11,480,883 B2
(45) Date of Patent: Oct. 25, 2022

(54) METHOD FOR OPERATING A MACHINE FOR MICROLITHOGRAPHY

(71) Applicant: Carl Zeiss SMT GmbH, Oberkochen (DE)

(72) Inventors: Michael Kamp-Froese, Aalen (DE); Dietmar Schnier, Garbsen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 373 days.

(21) Appl. No.: 16/291,206

(22) Filed: Mar. 4, 2019

(65) Prior Publication Data

US 2019/0278187 A1    Sep. 12, 2019

(30) Foreign Application Priority Data

Mar. 8, 2018 (DE) .......................... 102018105322.3

(51) Int. Cl.
  *G03F 7/20* (2006.01)
  *G06F 16/23* (2019.01)
  *G06F 16/25* (2019.01)

(52) U.S. Cl.
  CPC ...... *G03F 7/70508* (2013.01); *G03F 7/70525* (2013.01); *G03F 7/70533* (2013.01); *G06F 16/2379* (2019.01); *G06F 16/252* (2019.01)

(58) Field of Classification Search
  CPC ............ G03F 7/70508; G03F 7/70525; G03F 7/70533; G03F 7/70758;
  (Continued)

(56) References Cited

U.S. PATENT DOCUMENTS 5,041,976 A      8/1991  Marko et al.
8,660,875 B2 *   2/2014  Yedatore ............. G06F 11/2294
                                                      705/7.11
(Continued)

FOREIGN PATENT DOCUMENTS

DE    690 28 872    2/1997    ............. G06F 17/00
EP     0 398 481   11/1990    ............. G01R 31/00
(Continued)

OTHER PUBLICATIONS

The Korean Notice of Reasons for Rejection for Korean Application No. KR 10-2019-0025692, dated Jul. 7, 2020 (with English Translation).
(Continued)

*Primary Examiner* — Christina A Riddle
(74) *Attorney, Agent, or Firm* — Fish & Richardson P.C.

(57) ABSTRACT

The invention relates to a method for operating a machine for microlithography which has a multiplicity of machine components. According to one aspect, malfunctions of these machine components that occur during the operation of the machine are each describable by a symptom, wherein the method includes the following steps: creating a database in which a cause is in each case assigned to different combinations of these symptoms, automatically recording the symptoms occurring within a predetermined time interval when a problem occurs during the operation of the machine and automatically assigning a cause to the problem on the basis of the recorded symptoms and the database.

19 Claims, 5 Drawing Sheets

(58) Field of Classification Search
CPC .. G03F 7/70483–7541; G03F 7/70858–70891; G03F 7/708; G03F 7/70908; G03F 7/70975; G03F 7/70991; G03F 1/68; G03F 1/72; G03F 1/82; G03F 1/84; G03F 1/86; G06F 16/2379; G06F 16/252; H01L 21/027; H01L 21/67276; G05B 23/0283–0297; G05B 23/0208; G05B 23/021; G05B 23/0213; G05B 23/0216; G05B 2219/32014; G05B 2219/32246; G05B 2219/40131
USPC ............ 355/18, 40, 46, 52–55, 67–77, 133; 702/33, 34, 36, 40, 57–63, 182–186, 187
See application file for complete search history.

(56) References Cited

U.S. PATENT DOCUMENTS

| | | | |
|---|---|---|---|
| 8,718,353 B2 | 5/2014 | Li et al. | |
| 9,518,935 B2 | 12/2016 | Guan et al. | |
| 2002/0044104 A1* | 4/2002 | Friedrich | G05B 19/409 345/8 |
| 2002/0192579 A1* | 12/2002 | Kamono | G03F 7/70866 430/31 |
| 2003/0013213 A1* | 1/2003 | Takano | G03F 7/70525 438/14 |
| 2007/0244571 A1 | 10/2007 | Wilson et al. | |
| 2009/0240366 A1 | 9/2009 | Kaushal et al. | |
| 2010/0017167 A1* | 1/2010 | Duc | G05B 23/0251 702/185 |
| 2010/0058112 A1* | 3/2010 | Kim | G06F 11/2252 714/37 |
| 2011/0202160 A1 | 8/2011 | Moyne | |
| 2015/0105895 A1 | 4/2015 | Moyne et al. | |
| 2017/0228490 A1 | 8/2017 | Chung et al. | |
| 2018/0059529 A1 | 3/2018 | Jonckheere et al. | |
| 2019/0129891 A1 | 5/2019 | Sigtermans et al. | |

FOREIGN PATENT DOCUMENTS

| | | | |
|---|---|---|---|
| JP | H 10-289868 | 10/1998 | ........... H01L 21/027 |
| JP | H 10-307604 | 11/1998 | ............. G05B 15/02 |
| TW | 201033932 | 9/2010 | ............. C06Q 99/00 |
| TW | 201104452 | 2/2011 | ............. G06F 15/18 |
| TW | 201203163 | 1/2012 | ............. G06Q 50/00 |
| TW | 201514616 | 4/2015 | ............... G03F 1/84 |
| TW | 201514641 | 4/2015 | ............. G05B 13/02 |
| TW | 201719510 A | 6/2017 | |
| TW | 201738771 | 11/2017 | ............. G06F 15/18 |
| TW | 201802463 | 1/2018 | ............. G01N 21/95 |
| WO | WO 2013/158593 | 10/2013 | ............. G01B 11/24 |
| WO | WO 2014/159453 | 10/2014 | ............. G06F 17/50 |
| WO | WO-2017055073 A1 * | 4/2017 | ......... G03F 7/70525 |
| WO | WO-2017182269 A1 * | 10/2017 | ......... G03F 7/70508 |

OTHER PUBLICATIONS

Taiwan Office Action and Search Report for Taiwanese Application No. TW 108107653 dated Aug. 28, 2019 (with English Translation).
German Office Action for German Application No. DE 10 2018 105 322.3, dated Dec. 18, 2018.
The Office Action issued by the Taiwan Patent Office for Taiwan Patent Application No. 108107653, dated Apr. 19, 2021 (with English Translation).
The Final Rejection issued by the Taiwan Patent Office for Application No. TW 108107653 dated Nov. 16, 2021 (with English Translation).
Office Action and Search Report issued by the Taiwan Patent Office for Application No. TW 108107653, dated Aug. 19, 2022 (with English Translation).

* cited by examiner

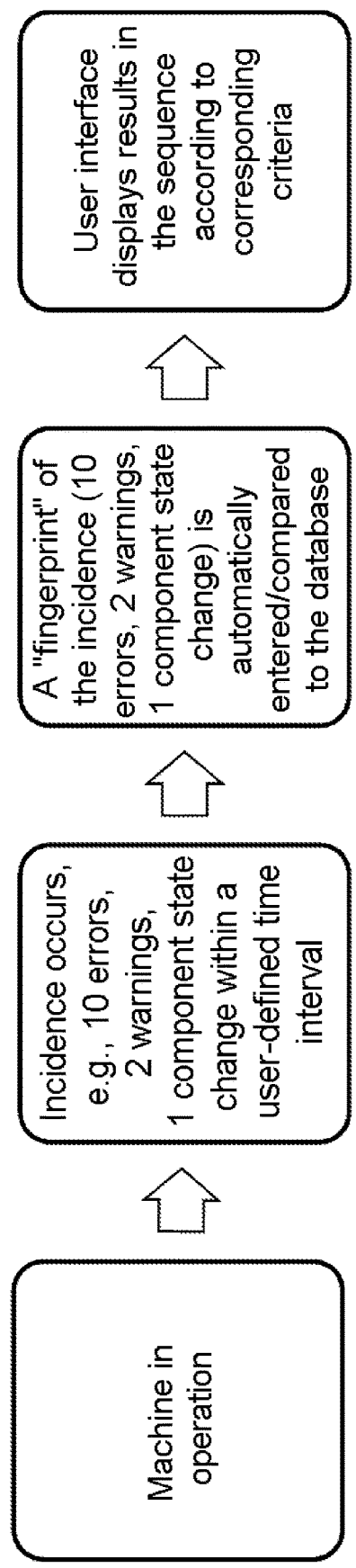

METHOD FOR OPERATING A MACHINE FOR MICROLITHOGRAPHY

CROSS REFERENCE TO RELATED APPLICATIONS

This application claims priority of German Patent Application DE 10 2018 105 322.3, filed on Mar. 8, 2018. The content of the above application is hereby incorporated by reference.

TECHNICAL FIELD

The invention relates to a method for operating a machine for microlithography, which has a multiplicity of machine components.

BACKGROUND

Microlithography is used for producing microstructured components such as, for example, integrated circuits or LCDs. The microlithography process is carried out in what is called a projection exposure apparatus, which comprises an illumination device and a projection lens. The image of a mask (also referred to as a reticle) illuminated by way of the illumination device is in this case projected by way of the projection lens onto a substrate (e.g., a silicon wafer) coated with a light-sensitive layer (photoresist) and arranged in the image plane of the projection lens, in order to transfer the mask structure to the light-sensitive coating of the substrate.

Mask inspection apparatuses are used for the inspection of masks for microlithographic projection exposure apparatuses.

Such mask inspection apparatuses, in particular mask inspection apparatuses designed for inspecting masks designed for EUV-operation, are an example of industrial machines of particularly high complexity since they have a comparatively large number of machine components (e.g., of the order of more than 10 000). Since, as a matter of principle, each of these machine components has associated with it a certain risk for the occurrence of malfunctions right up to complete failure of the respective machine component, a difficulty arising from this complexity in practice is that of, inter alia, finding within a justifiable time interval which machine component(s) is/are the cause of a respective problem when a problem occurs during the operation of the relevant machine (e.g., mask inspection apparatus). In particular, even if highly qualified staff are used, the assumption that the respective member of staff is an expert for all machine components present or all malfunctions occurring in the relevant context can be made less and less with increasing complexity of the industrial machine or machine for microlithography, respectively.

However, an excessively long time interval required to find the cause responsible for a problem occurring during the operation of the machine for microlithography has as a consequence unjustifiably long downtimes during the operation of the respective machine and hence, ultimately, unwanted losses in the throughput obtained by the machine.

These circumstances become ever more serious if, in addition to the above-discussed identification of the machine component(s) forming the root cause for the respective problem, the subsequent retrieval of the relevant machine component(s), required before a repair or replacement, still requires a significant time interval as a consequence of the great complexity of the machine for microlithography (for instance because a machine component identified as being the cause of the problem is arranged so as to be covered by various further machine components within the complex design of the machine).

A further problem resulting in practice from a high complexity of the design of a machine for microlithography such as a mask inspection apparatus, for example, may occur if the respective operating staff has to make a decision about the temporal sequence and/or selection of service processes in the form of maintenance, repair and/or software updates to be carried out since a high complexity of the machine also yields a corresponding large multiplicity of different options which may differ significantly from one another in respect of the efficiency and the ultimately required downtime during the operation of the machine.

SUMMARY

Against the aforementioned background, it is a general aspect of the present invention to provide a method for operating a machine for microlithography, wherein quick (e.g., the quickest possible) corrective actions are facilitated in the case of a problem occurring during operation, even in the case of a comparatively high complexity of the design of the machine.

This aspect is achieved by way of a method according to the invention for operating a machine for microlithography which has a multiplicity of machine components, wherein malfunctions of these machine components that occur during the operation of the machine are each describable by a symptom. The method includes the following steps:

creating a database in which a cause is in each case assigned to different combinations of these symptoms;

automatically recording the symptoms occurring within a predetermined time interval when a problem occurs during the operation of the machine; and automatically assigning a cause to the problem on the basis of the recorded symptoms and the database.

In particular, the invention is based on the concept of taking account of not only, for instance, a single error message of a machine component present in the machine when identifying the cause of a problem occurring during the operation of the complex machine for microlithography but, instead, using a combination of error messages or other symptoms to this end, which occur within a predetermined time interval. This combination of error messages or symptoms, which has occurred during the predetermined time interval, then can serve, as it were, as a characteristic fingerprint for the cause ultimately to be assigned to the problem and said combination can be used, based on a database, for identifying the cause.

Here, the invention deliberately accepts the outlay required at the outset for creating a corresponding database (in which a multiplicity of possible combinations of error messages or symptoms are respectively assigned to a cause) since, in return, application of the method according to the invention during operation of the machine then facilitates a fast identification of the cause and the introduction of suitable corrective measures.

Here, the method according to the invention also has the advantage of a particularly high flexibility insofar as the assignment of a cause to a certain combination of error messages or symptoms established in the predetermined time interval may also be implemented in scenarios in which the corresponding combination of error messages or symptoms is not yet identically present in the database created in advance. This is because, according to the invention, the cause assigned to the problem in this case can be the one whose assigned symptom combination in the database still corresponds with the actually captured symptom combination to the best extent. Here, where necessary, it is also possible to output several causes that come into consideration with an appropriate gradation or sequence.

As a result, the invention can realize, as quickly as possible, an identification of causes or of machine components that are the cause of a certain problem, even in scenarios in which the relevant malfunctions—for instance, due to the lack of the possibility of suitable digitization—are not accompanied by an error message that can be interpreted uniquely and/or in which this relates to a new combination, or a combination that has not yet occurred in earlier operation, of error messages or symptoms.

The flexibility of the method according to the invention can be increased further by virtue of it being possible, on part of the user, to predetermine whether or not the temporal sequence of the symptoms recorded during the relevant time interval should be significant in relation to the assignment of a cause to the problem that occurred during the operation of the machine. As a result of this, it is possible, on part of the user, to flexibly take account of the fact that, for example, the relevant errors or symptoms may have occurred in a different sequence in the past or that, conversely, the temporal sequence, in particular, is particularly characteristic for the presence of a certain cause.

Moreover, a high flexibility of the method according to the invention also arises from the fact that a flexible selection of the combination of symptoms or error messages (e.g., depending on the frequency of the occurrence thereof) to be taken into account in the database can already be made, depending on the specific application, when creating the database in advance. Here, it is possible to take account of both experience gained in the past (e.g., in respect of the occurrence of certain combinations of symptoms or errors) and the corresponding failure probabilities of the individual machine components (wherein these failure probabilities may, in turn, be based on manufacturer specifications or else empirical values). Here, according to the invention, it is possible for symptom or error combinations with a comparatively low probability to be excluded from the database in advance, and so, as a result, the database volume and the time outlay required for the evaluation can be restricted, even in the case of a particularly high complexity of the machine.

According to one embodiment, the database is created taking account of failure probabilities of the machine components.

According to one embodiment, the database is created taking account of malfunctions of the machine components that occurred in the past.

According to one embodiment, a combination of symptoms which is present in the database and which best describes a group of recorded symptoms is determined within the scope of the step of automatically assigning a cause to the problem.

According to one embodiment, the automatic assignment of a cause is implemented taking account of the temporal sequence of the symptoms that occurred within the predetermined time interval, depending on a user prescription.

According to one embodiment, when a malfunction of a machine component occurs, information is automatically provided to help an operator find this machine component.

According to one embodiment, this provision of information is implemented by transmitting a multi-part information item for leading an operator to the machine component step-by-step.

This aspect of the invention is advantageous, also independently of the above-described, database-based identification. Therefore, the invention further also relates to a method for operating a machine for microlithography which has a multiplicity of machine components, wherein malfunctions of these machine components that occur during the operation of the machine are each describable by a symptom, wherein, when a malfunction of the machine component occurs, information is automatically provided to help an operator find this machine component by way of transmitting a multi-part information item for leading an operator to the machine component step-by-step.

Consequently, the invention further also contains a concept of providing, e.g., automatically in reaction to the establishment of a malfunction of a machine component, a multi-part information item for leading an operator to the relevant machine component step-by-step. The provision of such a multi-part information item for the leading the operator step-by-step may comprise, in particular, an automatic production of three images (e.g., in reaction to the input of a certain cause or error message). Here, a first image may contain a comparatively coarse subdivision of the machine for microlithography into a plurality of regions, with the region containing the machine component to be found being highlighted. A second image can illustrate the respective machine components situated in the direct vicinity of the machine component to be found. A third image may illustrate the machine component itself.

According to one embodiment, the method further includes the following steps:
creating a further database in which a multiplicity of service processes are linked to one another in respect of respectively suitable temporal sequences; and
outputting a temporal sequence for working through these service processes on the basis of the further database as a reaction to a user-side input of the desired combination of service processes to be carried out.

According to one embodiment, the aforementioned output step comprises the output of a temporal sequence of these service processes and further service actions to be carried out in combination with these service processes. Here, in particular, this may relate to service actions that are carried out in combination with the desired service processes in order to reduce or minimize the time duration required for the service processes in the long-term.

The above-described aspect of the invention is also advantageous independently of the above-described aspects of the database-based identification and the retrieval of, or step-by-step leading to, the machine component. Therefore, the invention further also relates to a method for operating a machine for microlithography, which has a multiplicity of machine components, wherein the method includes the following steps:
creating a database in which a multiplicity of service processes are linked to one another in respect of respectively suitable temporal sequences; and
outputting a temporal sequence for working through these service processes on the basis of this further database as a reaction to a user-side input of a desired combination of service processes to be carried out.

Here too, the output step may comprise the output of the temporal sequence of these service processes and further service actions that are to be carried out in combination with the service processes, wherein this may, once again, relate to service actions that are carried out in combination with the desired service processes in order to reduce or minimize the time duration required for service processes in the long-term.

According to one embodiment, the method further includes the step of: outputting one or more service processes that should be carried out within a time interval in reaction to a user-side input of an available time interval for carrying out service processes.

According to one embodiment, the output is implemented with the prescription of a temporal sequence that should be observed when carrying out these service processes.

Consequently, the invention further also contains the concept of assisting an operator with carrying out certain pending service processes (which could relate to maintenance, repairs of software updates, for example) by way of outputting a particularly suitable temporal sequence for working through the relevant service processes, the provision of this information once again being implemented automatically on the basis of a database correspondingly created in advance. As a result of this, an optimization can be achieved by virtue of the relevant machine being able to be started up again as quickly as possible despite the pending service processes and being operational, or by virtue of the time required for the service processes being reduced as far as possible by an expedient combination of service processes.

The selection of the temporal sequence for carrying out the relevant service processes, suitable to this end, may, in particular, take account of the state changes accompanied by the respective service processes (e.g., temperature and/or pressure change machine and necessary reconfiguration measures) in the process. Moreover, in embodiments of the invention, there can be an automatic output of a certain group of service processes (optionally in a defined sequence again) which should be carried out within a predetermined time interval, even for, e.g., a defined time interval (e.g., 48 hours) predefined on part of the user. Here, the relevant database can take account of, in particular, the prioritized implementation of safety-relevant service processes and the frequency with which certain service processes, such as maintenance work, have to be carried out. Further, the availability of replacement parts and necessary tools, and the staff requirements for the service actions can be taken into account in the automatic selection of the service actions to be carried out.

As a result, it is possible to fill the time interval available for service processes particularly efficiently and, at the same time, ensure that the machine for microlithography is operational again immediately after the relevant time interval has elapsed.

According to one embodiment, the machine for microlithography is a mask inspection apparatus for inspecting microlithographic masks. The advantages obtained by the method according to the invention are particularly showcased in such an application on account of the comparatively high complexity (e.g., as a result of necessary vacuum and purge gas systems or in view of particularly demanding cleanroom requirements). However, the invention is not restricted thereto but, instead, is also advantageously realizable in other applications or machines with high complexity.

Further configurations of the invention can be gathered from the description and the dependent claims.

The invention is explained in greater detail below on the basis of exemplary embodiments illustrated in the accompanying figures.

BRIEF DESCRIPTION OF DRAWINGS

In the Figures.

DETAILED DESCRIPTION

Figure 1A:
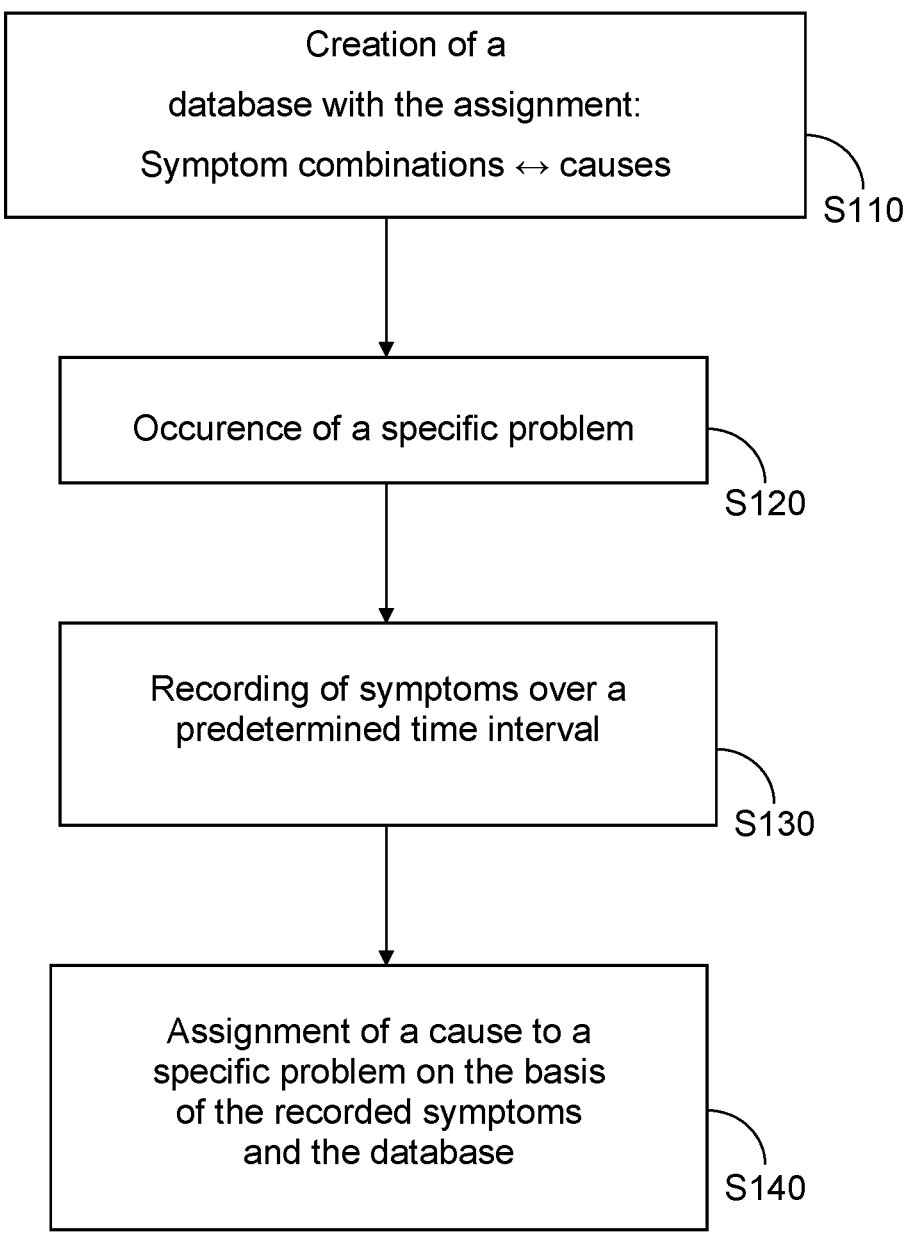
FIGS. 1-4 show schematic illustrations for explaining exemplary embodiments of the present invention.

Initially, one possible embodiment of the method according to the invention is explained in more detail below with reference to the flowchart illustrated in FIG. 1A.

One of the goals of this method according to the invention is, in a complex machine for microlithography, which may be a mask inspection apparatus for inspecting microlithographic masks (in particular microlithographic masks designed for operation in the EUV), to identify as quickly as possible a cause that is responsible for a problem when said problem occurs during the operation of the machine in order thus in turn to be able to introduce suitable corrective measures as quickly as possible. Examples of problems that may occur in a complex machine for microlithography include a cooling water leakage that could, e.g., at the same time be responsible for other critical failures in other critical components such as the mask handling system, the EUV source and the vacuum system. Since all those systems can also send out or register critical errors, in all three cases the machine can register multiple critical errors and it may not be clear what the origin is.

According to the invention, this identification is not based merely on a single error message (e.g., produced by one of the machine components) within the machine but instead on a combination of error messages or other symptoms (e.g., failure of a display, state change in a component, etc.).

To this end, a database is initially created in a first step S110, in which different combinations of such symptoms and error messages are each assigned to a cause that is responsible for the relevant problem. For example, when the problem is that the vacuum system fails, the cause may be a failure in the cooling system, but the same problem of a failure of the vacuum system may also be caused by a faulty vacuum pump unrelated to the cooling system. The creation of this database can be based on pooling experience gained in the past (e.g., to the effect of what combinations of symptoms could ultimately be traced back to what cause), wherein, further, it is also possible to take account of failure probabilities of individual machine components (e.g., on the basis of manufacturer specifications or empirical values).

As soon as a specific problem now occurs during the operation of the machine for microlithography (step S120), symptoms (such as error messages of individual machine components, for example) are recorded, according to the invention, over a predetermined time interval (e.g., defined on part of the user). The machine is capable of determining that a problem has occurred even if the user may be responsible for it, but it is not necessarily able to determine what the root cause was. Subsequently, a cause of the problem that occurred during the operation of the machine is identified taking account of the assignments already present in the database, depending on the combination of symptoms recorded within the time interval in the process (step S140).

The output of a cause as a result of the method according to the invention can also be implemented if no 100% correspondence is found between the captured symptom combination and the symptom combinations stored in the database. For example, in an exemplary scenario in which eight error messages and two further symptoms have occurred within the predetermined time interval and there is a lack of complete correspondence in the database, it is possible to output the cause for which the best correspondence arises (e.g., at least a correspondence in nine of the ten symptoms). In this way, it is also possible to successfully process scenarios in which novel symptom combinations or symptom combinations that have not occurred previously are present or in which it is not possible to establish a complete correspondence with the database (e.g., on account of input errors).

In an exemplary scenario illustrated in FIG. 1B, an incidence, for example, occurs after the machine was started up, said incidence being characterized in the example by the occurrence of ten errors, two warnings and a component state change within a user-defined time interval. Examples of component state change include a change in the vacuum system state from "vented" to "roughing vacuum" to "high vacuum", or a change of the mask handling system from "initialization" to "standby/ready for operation" to "actively moving." This "fingerprint" of the incidence is automatically compared to the database, whereupon a user interface displays the appropriate results, or causes that come into question, in a suitable sequence which arises from the implemented comparison and the respective correspondence with the symptom combinations stored in the database.

Even after the machine component that is a cause for a problem that has occurred during the operation of the machine has been identified, actually finding this component may still require an unjustifiably long period of time if the machine is very complex. To make it easier to find a specific machine component, e.g., the machine component identified in the above-described method, it is possible—as elucidated in the schematic illustration of FIG. 2—to automatically provide a multi-part information item for leading an operator to the relevant machine component step-by-step.

Figure 2:
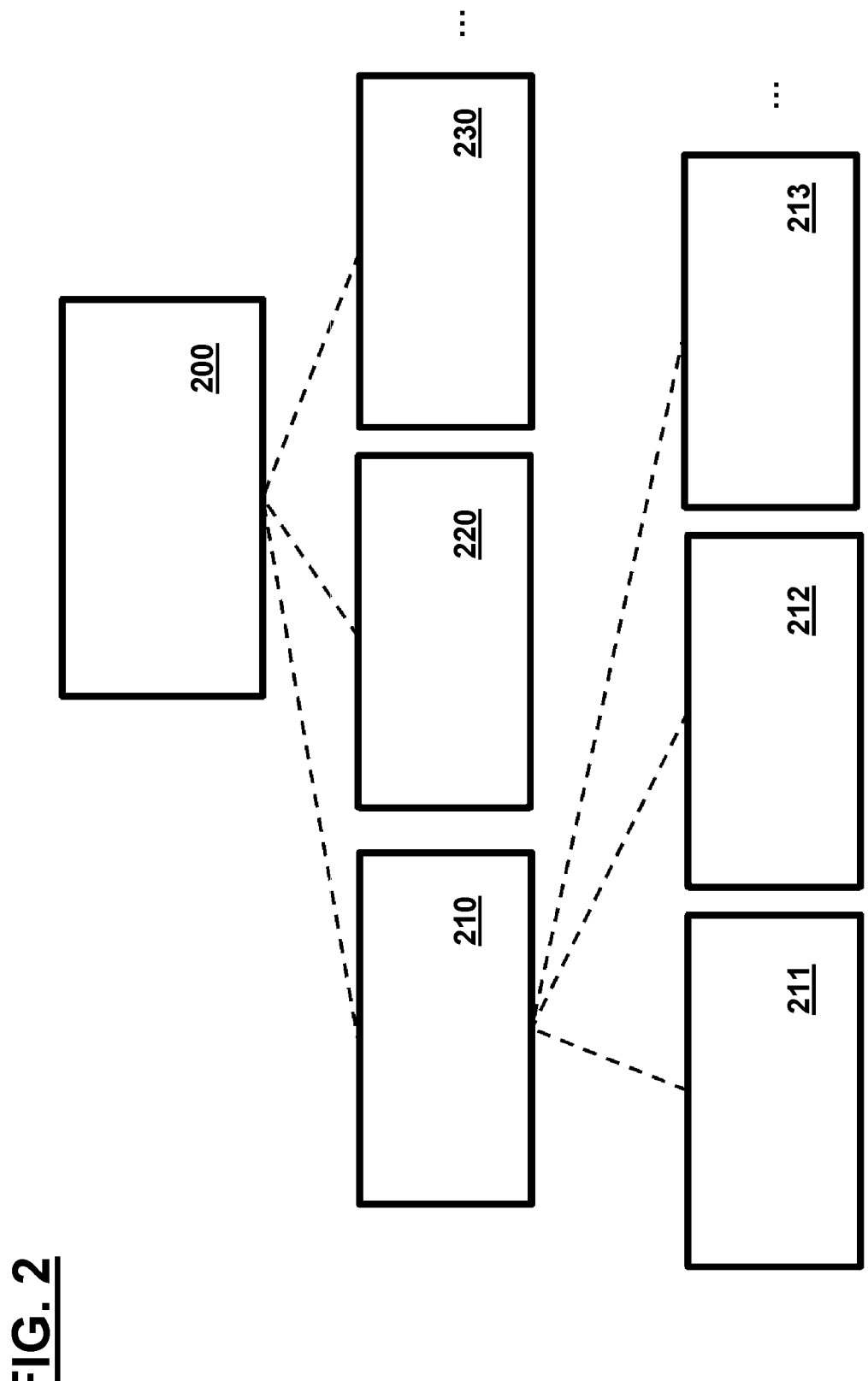

To this end, a plurality of images (e.g., three images) can be produced on appropriate displays in a specific exemplary embodiment, the first image directing the operator to one of a plurality of regions within the machine (on the basis of an appropriate coarse subdivision), a second image showing the machine components present immediately adjacent to the machine component to be found and a third image showing the machine component itself (e.g., a valve or a temperature sensor with a specific ID number). In FIG. 2, the block 200 represents the entire machine, the blocks 210, 220, 230, . . . represent the coarse subdivision thereof into a plurality of regions and the blocks 211, 212, 213, . . . represent the respective machine components present within the region 210.

As a result, the operator is successively led to the machine component to be found and initially learns about the approximate position thereof (e.g., arrangement in a specific cabinet), subsequently, learns about more specific positioning thereof (e.g., within a certain level in this cabinet or in the vicinity of certain other machine components) and finally obtains an image of the machine component itself. The image may also contain a 3-D model.

Figure 3:
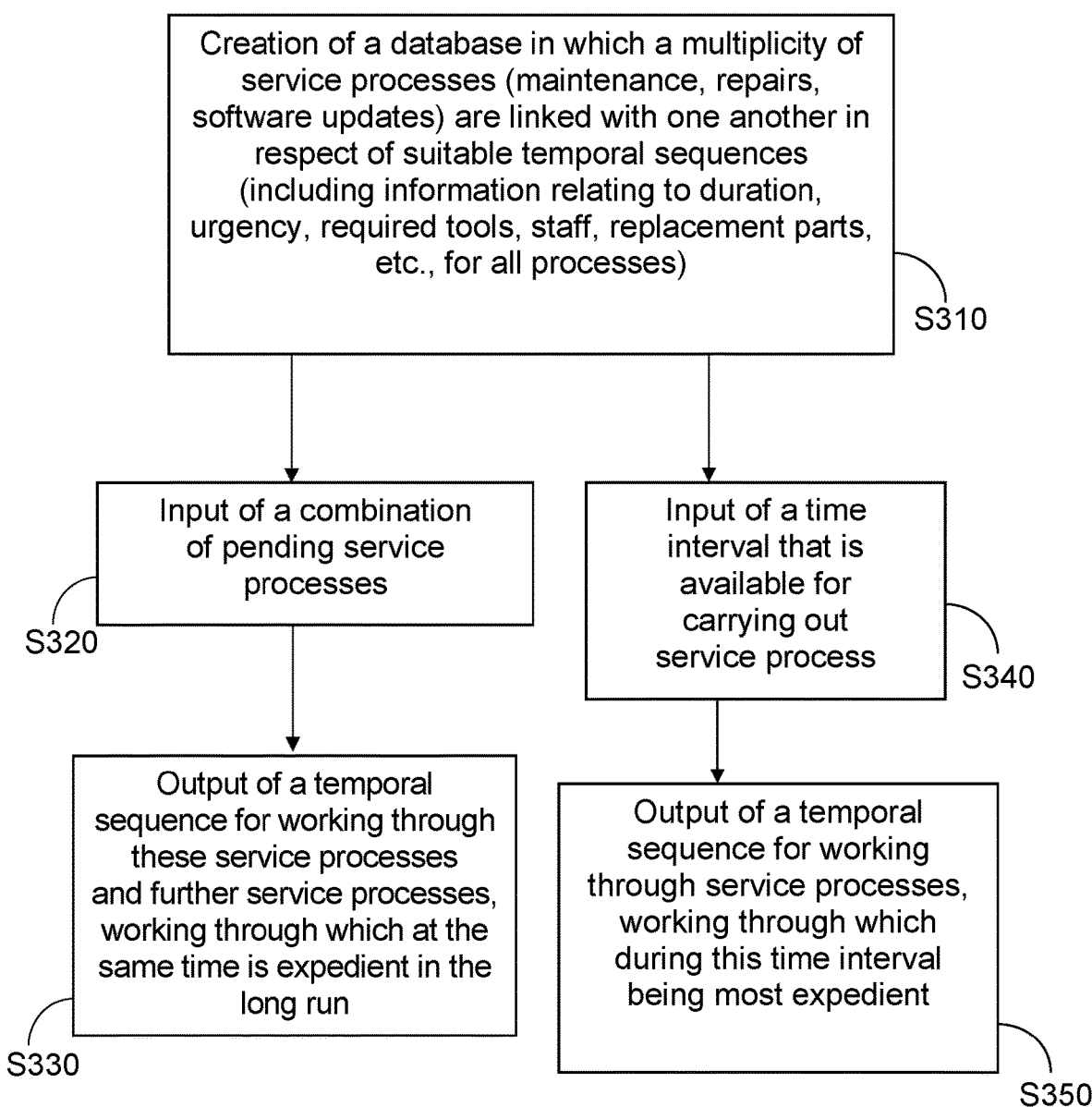

FIG. 3 shows a flowchart for explaining a method in a further embodiment of the invention.

According to FIG. 3, a database is once again initially created (step S310), a multiplicity of service processes (e.g., maintenance, repairs or software updates) being linked with one another in respect of suitable temporal sequences in said database. As a reaction to the input of a desired combination of service processes to be carried out or the input of an available time interval (step S320 and S340, respectively), a suitable temporal sequence for working through service processes is output in step S330 and S350, respectively. In step S320, the input of the desired combination of service processes to be carried out can be provided by both the machine and the user or by the user alone. The required combination of service processes to be carried out may be defined by the predefined maintenance actions as well as the current machine state with respect to possible required repairs and software updates.

In S340, the input of the available time interval is provided by the user. In an example, 10 service processes are required to be performed. The total required time for all 10 services processes is 5 hours and the user only has 3 hours. The system determines that processes 1-6 can be performed within the 3 hours. Then the remaining 4 service processes can be performed at a later time, and the system would provide instructions to the user which service processes can be performed in the allotted time.

Figure 4:
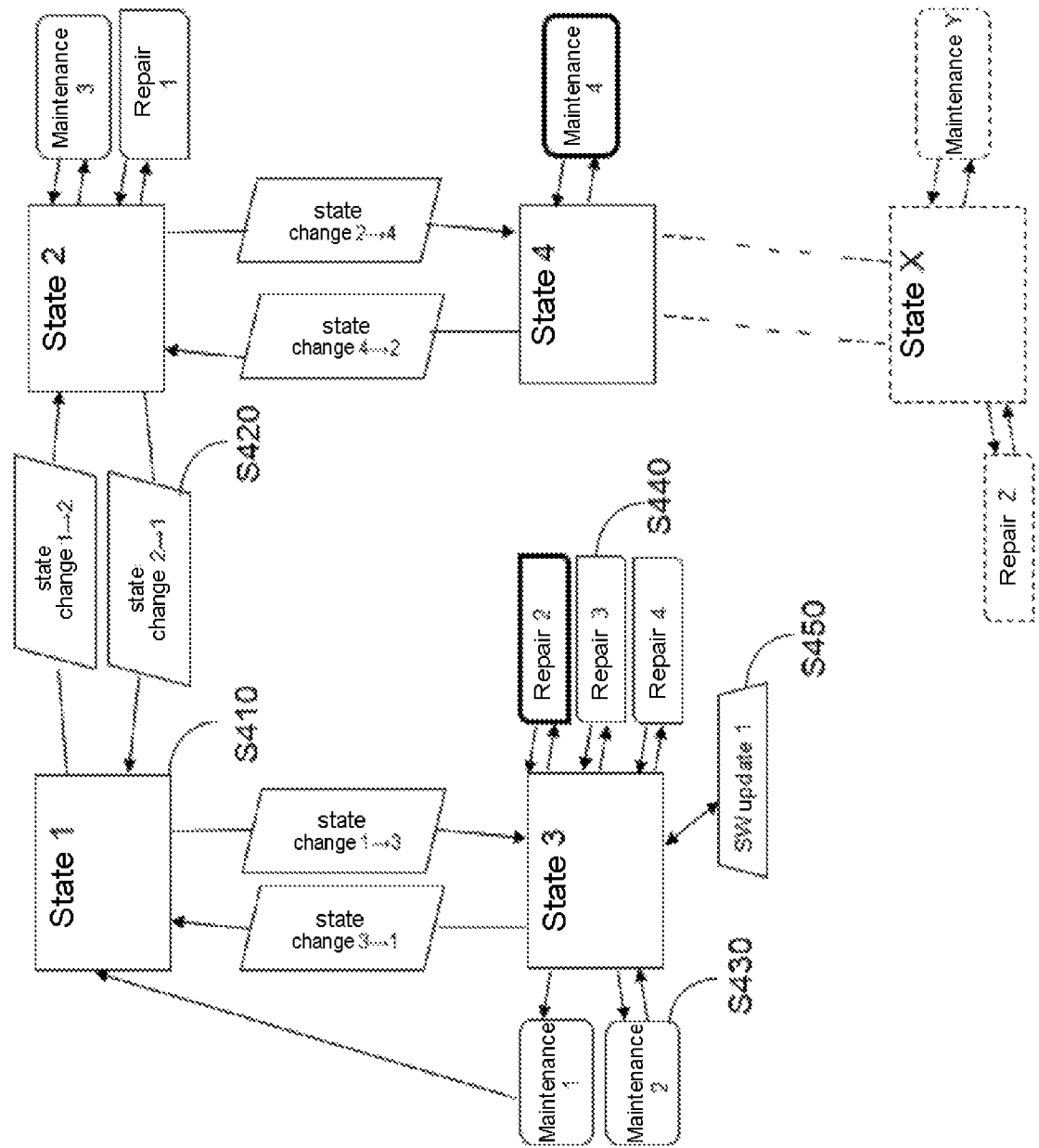

FIG. 4 shows a flowchart for explaining a method in a further embodiment of the invention.

According to FIG. 4, a database is once again initially created, a multiplicity of service processes (e.g., maintenance, repairs or software updates) being linked with one another in respect of suitable temporal sequences by virtue of said service processes being assigned to certain machine states (hardware and software) that the machine has to adopt before the actual service action can be carried out. Here, the changes between various machine states form independent service actions.

The most expedient temporal sequences of pending service processes can be derived directly from the topology of this flowchart and the data in respect of duration, urgency, etc., that are stored in the database in relation to these processes. The problem is analogous to that of a travelling salesman problem, and so existing problem solutions can be used in the optimization of the temporal sequences of pending service processes.

This is a very much simplified example which has a few machine states and transitions for the purposes of elucidating the principles. It is also possible to take account of a multiplicity of machine states, which can be networked among themselves as required, in the case of complex machines such as mask inspection apparatuses. Additionally, the number of considered service actions can be several thousand, for example. In this case, it may be helpful to select, e.g., different forms or colours for states (e.g., S410) and different types of service actions such as repairs (e.g., S440), maintenance (e.g., S430), software updates (e.g., S450) or reconfiguration between machine states (e.g., S420) within the scope of the graphical representation of the totality of all actions and states. It is also possible to highlight the urgency, frequency or duration of service actions using colours (e.g. "Repair 2" & "Maintenance 4") so that this already directs the view to the essential actions in the overall overview. Hence, a service technician is better able to identify expedient alternatives for the automatic selection and sequence of service actions to be carried out.

In some implementations, the machine for microlithography includes a computer module to assist in implementing the processes described in this document, such as enabling the user to generate a database in which a cause is in each case of malfunction of a machine component assigned to different combinations of the symptoms, automatically recording the symptoms occurring within a predetermined time interval when a problem occurs during the operation of the machine, and automatically assigning a cause to the problem on the basis of the recorded symptoms and the database. The computer module can include one or more data processors for processing data, one or more storage devices for storing data, such as one or more databases, and/or one or more computer programs including instructions that when executed by the computer module causes the computer module to carry out the processes. The computer module can include one or more input devices, such as a keyboard, a mouse, a touchpad, and/or a voice command input module, and one or more output devices, such as a display, and/or an audio speaker. The computer module can show graphical user interfaces on the display to assist the user of the machine for microlithography in generating the databases, and showing the multi-part information item for leading the user to a particular machine component that needs to be fixed or replaced.

In some implementations, a manufacturer or supplier of the machine for microlithography may already know the relationships between the causes of some generic problems and different combinations of the symptoms, and have information (e.g., multi-part information) for helping an operator solve the problems, e.g., information for finding the machine components that need to be repaired or replaced, and/or information about procedures for repairing or replacing the machine components. In this case, when the machine is shipped to a customer (e.g., operator of the machine), the computer module of the machine already includes an initial database having information relevant to solving the generic problems. The computer module is configured to provide a user interface that allows the customer (e.g., operator of the machine) to modify, update, or otherwise customize the database to add more information for solving additional problems specific to the customer. In some implementations, the machine for microlithography is shipped to the customer without an initial database, and the customer (e.g., operator of the machine) creates a new database having relevant information.

In some implementations, the computer module can be located external to the machine for microlithography. The computer module can communicate with the machine for microlithography through a data bus or a network, such as a local area network or the Internet. For example, the computer module can be implemented using one or more cloud computer servers. In some implementations, some of the data processing is performed at a computer module integrated with the machine for microlithography, and some of the data processing is performed at an external computer module.

In some implementations, information is provided to the user using a head-mounted computing device having a see-through display that shows the information in an augmented reality format, in which the information is overlaid on actual objects. For example, when the user views the machine for microlithography through the see-through display, one of a plurality of regions within the machine is highlighted on the display. As the user moves closer to and looks toward the region, machine components present immediately adjacent to the machine component to be found are highlighted on the display. As the user moves closer to and looks towards the machine components immediately adjacent to the machine component to be found, the machine component to be found itself is highlighted on the display. This allows the user to quickly find the machine component that needs to be repaired or replaced.

In some implementations, information is provided to the user using a tablet computer having a display that shows the information in an augmented reality format, in which the information is overlaid on images of actual objects. For example, the user may hold the tablet in front of the machine for microlithography, a camera of the tablet captures images of the machine for microlithography, shows images of the machine for microlithography on the tablet display, and highlights one of a plurality of regions within the machine on the tablet display. As the user moves closer to and holds the tablet computer closer to the region, images of the region within the machine are shown on the tablet display, and the machine components present immediately adjacent to the machine component to be found are highlighted on the tablet display. As the user moves closer to and holds the tablet computer closer to the machine components immediately adjacent to the machine component to be found, images of the machine components immediately adjacent to the machine component to be found are shown on the tablet display, and the machine component to be found itself is highlighted on the tablet display. This allows the user to quickly find the machine component that needs to be repaired or replaced. In some implementations, the computer module can include digital electronic circuitry, computer hardware, firmware, software, or any combination of the above, configured to carry out the method steps described above. The features related to processing of data can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or in addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

In some implementations, the operations associated with processing of data described in this document can be performed by one or more programmable processors executing one or more computer programs to perform the functions described in this document. A computer program can be written in any form of programming language, including compiled or interpreted languages, and it can be deployed in any form, including as a stand-alone program or as a module, component, subroutine, or other unit suitable for use in a computing environment.

For example, the computer module is configured to be suitable for the execution of a computer program and can include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as hard drives, magnetic disks, magneto-optical disks, or optical disks. Machine-readable storage media suitable for embodying computer program instructions and data include various forms of non-volatile storage area, including by way of example, semiconductor storage devices, e.g., EPROM, EEPROM, and flash storage devices; magnetic disks, e.g., internal hard disks or removable disks; magneto-optical disks; and CD-ROM and DVD-ROM discs.

In some implementations, the processes for operating a machine for microlithography described above can be implemented using software for execution on one or more mobile computing devices, one or more local computing devices, and/or one or more remote computing devices. For instance, the software forms procedures in one or more computer programs that execute on one or more programmed or programmable computer systems, either in the mobile computing devices, local computing devices, or remote computing systems (which may be of various architectures such as distributed, client/server, or grid), each including at least one processor, at least one data storage system (including volatile and non-volatile memory and/or storage elements), at least one wired or wireless input device or port, and at least one wired or wireless output device or port.

In some implementations, the software may be provided on a medium, such as a CD-ROM, DVD-ROM, or Blu-ray disc, readable by a general or special purpose programmable computer or delivered (encoded in a propagated signal) over a network to the computer where it is executed. The functions may be performed on a special purpose computer, or using special-purpose hardware, such as coprocessors. The software may be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Even though the invention has been described on the basis of specific embodiments, numerous variations and alternative embodiments are apparent to a person skilled in the art, for example by combination and/or exchange of features of individual embodiments. Accordingly, it goes without saying for the person skilled in the art that such variations and alternative embodiments are concomitantly encompassed by the present invention, and the scope of the invention is restricted only within the meaning of the appended patent claims and the equivalents thereof.

What is claimed is:

1. A method for operating a machine for microlithography which has a multiplicity of machine components, wherein malfunctions of these machine components that occur during the operation of the machine are each describable by a symptom, wherein the method includes the following steps:
    a) creating or modifying, using one or more computers, a database having information about causes of problems of the machine and information about combinations of symptoms, in which a cause is in each case assigned to different combinations of these symptoms, in which each symptom describes the corresponding malfunction of one or more components of the machine for microlithography during the operation of the machine for microlithography, and the database is stored in a storage device;
    b) automatically recording, using the one or more computers, the symptoms occurring within a predetermined time interval when a problem occurs during the operation of the machine; and
    c) automatically assigning, using the one or more computers, a cause to the problem on the basis of the recorded symptoms and the database.

2. The method according to claim 1, wherein the creation or modification of a database in step a) is implemented taking account of failure probabilities of the machine components.

3. The method of claim 2 in which the creation or modification of a database in step a) is implemented taking account of malfunctions of the machine components that occurred in the past.

4. The method according to claim 1, wherein the creation or modification of a database in step a) is implemented taking account of malfunctions of the machine components that occurred in the past.

5. The method according to claim 1, wherein a combination of symptoms which is present in the database and which best describes a group of recorded symptoms is determined within the scope of step c) of automatically assigning a cause to the problem.

6. The method according to claim 1, wherein the automatic assignment of a cause in step c) is implemented taking account of the temporal sequence of the symptoms that occurred within the predetermined time interval, depending on a user prescription.

7. The method according to claim 1, wherein, when a malfunction of the machine component occurs, information is automatically provided to help an operator find this machine component.

8. The method according to claim 7, wherein this provision of information is implemented by transmitting a multipart information item for leading an operator to the machine component step-by-step.

9. The method according to claim 1, wherein the method further includes the following steps:
    creating a further database in which a multiplicity of service processes are linked to one another in respect of respectively suitable temporal sequences; and
    outputting a temporal sequence for working through these service processes on the basis of this further database as a reaction to a user-side input of a desired combination of service processes to be carried out.

10. The method according to claim 9, wherein the output step comprises the output of a temporal sequence of these service processes and further service actions to be carried out in combination with these service processes.

11. The method according to claim 9, wherein said method further includes the step of: outputting one or more service processes that should be carried out within a time interval in reaction to a user-side input of an available time interval for carrying out service processes.

12. The method according to claim 11, wherein this output is implemented with the prescription of a temporal sequence that should be observed when carrying out these service processes.

13. The method according to claim 1, wherein the machine for microlithography is a mask inspection apparatus for inspecting microlithographic masks.

14. A method for operating a machine for microlithography which has a multiplicity of machine components, wherein malfunctions of these machine components that occur during the operation of the machine are each describable by a symptom, wherein, when a malfunction of a machine component occurs, information is automatically provided, using a head-mounted computing device having a see-through display that shows the information in an augmented reality format, or a tablet computer having a display that shows the information in an augmented reality format, to help an operator find this machine component by way of transmitting a multi-part information item from the head-mounted computing device or the tablet computer to the operator for leading the operator to the machine component step-by-step;
wherein the method further comprises:
creating or modifying a database in which a multiplicity of service processes are linked to one another in respect of respectively suitable temporal sequences; and
outputting a temporal sequence for working through these service processes on the basis of the database as a reaction to a user-side input of a desired combination of service processes to be carried out.

15. The method of claim 14 in which the machine for microlithography comprises a mask inspection apparatus for inspecting microlithographic masks.

16. A method for operating a machine for microlithography, which has a multiplicity of machine components, wherein the method includes the following steps:
creating or modifying a database in which a multiplicity of service processes are linked to one another in respect of respectively suitable temporal sequences; and
outputting a temporal sequence for working through these service processes on the basis of the database as a reaction to a user-side input of a desired combination of service processes to be carried out, in which outputting a temporal sequence comprises outputting a temporal sequence of these service processes and further service actions to be carried out in combination with these service processes.

17. The method of claim 16, further comprising outputting one or more service processes that should be carried out within a time interval in reaction to a user-side input of an available time interval for carrying out service processes.

18. The method of claim 16 in which the machine for microlithography comprises a mask inspection apparatus for inspecting microlithographic masks.

19. A method for operating a machine for microlithography, which has a multiplicity of machine components, wherein the method comprises:
creating or modifying a database in which a multiplicity of service processes are linked to one another in respect of respectively suitable temporal sequences;
outputting a temporal sequence for working through these service processes on the basis of the database as a reaction to a user-side input of a desired combination of service processes to be carried out; and
outputting one or more service processes that should be carried out within a time interval in reaction to a user-side input of an available time interval for carrying out service processes.

* * * * *

UNITED STATES PATENT AND TRADEMARK OFFICE
CERTIFICATE OF CORRECTION

PATENT NO. : 11,480,883 B2  
APPLICATION NO. : 16/291206  
DATED : October 25, 2022  
INVENTOR(S) : Michael Kamp-Froese and Dietmar Schnier Page 1 of 1

It is certified that error appears in the above-identified patent and that said Letters Patent is hereby corrected as shown below:

In the Drawings

Sheet 1 of 5  
FIG. 1A, in block S120, delete "Occurence" and insert -- Occurrence --

Signed and Sealed this  
Twenty-seventh Day of December, 2022

Katherine Kelly Vidal  
*Director of the United States Patent and Trademark Office*